United States Patent [19]

Orr

[11] 3,727,620

[45] Apr. 17, 1973

[54] RINSING AND DRYING DEVICE

[75] Inventor: Robert F. Orr, Livermore, Calif.

[73] Assignee: Fluoroware of California, Inc., Fremont, Calif.

[22] Filed: Mar. 18, 1970

[21] Appl. No.: 20,667

[52] U.S. Cl. ....................134/95, 134/140, 134/153, 156/345

[51] Int. Cl. ..............................................B08b 3/02

[58] Field of Search........................134/95, 102, 140, 134/153, 158; 156/345

[56] References Cited

UNITED STATES PATENTS

| | | | |
|---|---|---|---|
| 1,261,778 | 4/1918 | Deming | 134/95 |
| 2,562,076 | 7/1951 | Weisselberg | 134/158 X |
| 3,690,333 | 9/1972 | Kierner | 134/140 X |
| 3,630,804 | 12/1971 | Coffman | 134/153 X |

*Primary Examiner*—Robert L. Bleutge
*Attorney*—Eckhoff and Hoppe

[57] ABSTRACT

An automatic rinsing and drying device for batch processing of thin wafers such as those used as microelectronic substrates and the like. The wafers are supported in a carrier basket on a rotating member during a programmed cycle of a sprayed rinsing with deionized water and a high speed spin drying sequence during a continuous dry nitrogen purge. The duration of the rinse and drying sequences are independently timed and the speed of revolution during the drying sequence is independently adjustable to suit each batch. The rotating member is encircled by a double walled tub and a hinged lid during the processing cycle. Spray nozzles are positioned over the wafers to apply the rinsing fluid over the faces of the wafers as they rotate thereunder. The tub is Teflon lined and has multiple drain outlets to remove the spent rinse fluid from the cleansed wafer surfaces. Provision is also made for substitution of different sized rotary members to accommodate various basket sizes and wafer loads.

9 Claims, 4 Drawing Figures

INVENTOR
ROBERT F. ORR
BY Eckhoff and Hoppe
ATTORNEYS

INVENTOR
ROBERT F. ORR

BY Schroff and Kopper

ATTORNEYS

INVENTOR
ROBERT F. ORR
BY [signature]
ATTORNEYS

RINSING AND DRYING DEVICE

BACKGROUND OF THE INVENTION

This invention relates to improvements in a rinsing and drying device having commercial application for meeting the demands imposed in processing thin wafers such as those used for microelectric substrates in semiconductive devices and the like.

The use of thin wafers of glass, ceramic and semiconductive materials is increasing in the electronic industry as support substrates for thin film microelectronic circuits. Briefly, electrical components, defining the circuit, are built up on wafers or chips of these materials by either a vapor depositing or an etching method. A suitable masking technique is employed to ensure proper placement of the circuit components. Because of the extremely thin films and rigid tolerances used in this technology and to ensure proper adherence of the film, it is essential that the substrate surface be absolutely clean and free of any foreign contaminates.

While it has been known to clean surfaces by spray rinsing and spin drying, several problems and conditions are presented in this particular field. For instance, the high degree of cleanliness essential and the fragile and brittle nature of the wafers coupled with the requirements of mass production make prior devices unsuited for meeting the specifications imposed in this field in an efficient manner.

Thus, consideration must be given to the strength limitations of the wafers, particularly during the spin drying operation when a high centrifugal force is imposed to remove the spent fluid. To arrive at the best processing procedure, it is desirable that the parameters under which the rinsing and drying cycles are run be tailored to each individual batch and that the device have the necessary flexibility to achieve these ends.

SUMMARY OF THE INVENTION

It is therefore a principal object of the present invention to provide a device capable of performing a high quality rinsing and drying operation on batch lots of thin wafers and which has provision for changing the parameters under which a given operation is run to accommodate different batch lots and run each lot under the optimum condition.

Another object is to provide a device having a high degree of flexibility but which is compatible with existing manufacturing processes and which has provision for pre-programming of its control sequence, including the duration and speed of revolution of the separate segments thereof, and to carry out automatically a preset sequence without further attention.

A further object is to provide a device adapted to rotate the wafers at a slow rate of speed (of the order of 100 rpm) with their faces upstanding about a vertical axis while streaming deionized water over the faces of the wafers and removing any foreign material therefrom. Then, to spin the wafers at a high rate of speed (of the order of 2,000–3,000 rpm) to remove the spent water by centrifugal force. All the while continuously injecting a dry nitrogen purge to remove efficiently the spent fluids from the area of the cleansed wafers.

Another object is to support the wafers' carrier basket in closely confined relation during a high speed spin and to make provision to easily change the supporting device so as to accommodate different size carrier baskets and wafer loads.

BRIEF DESCRIPTION OF THE DRAWINGS

The preferred form of the invention is illustrated in the accompanying drawings forming part of this specification, in which.

DESCRIPTION OF THE PREFERRED EMBODIMENT

Figure 1:
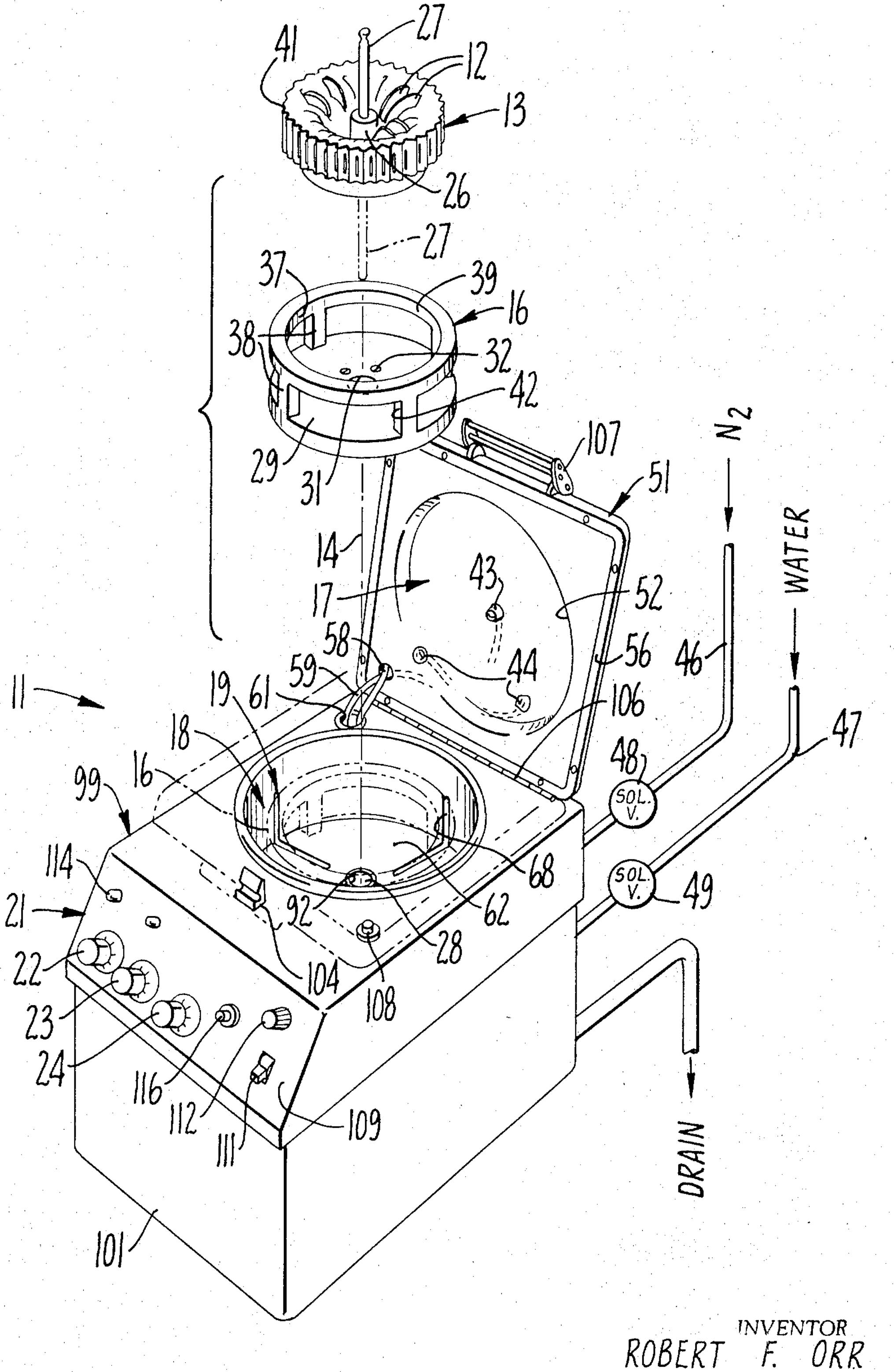
FIG. 1 is a perspective view illustrating the preferred embodiment of the present invention in which the replaceable wafer carrier basket and rotary member are shown in exploded position from their normal operating position.
Figures 2, 3:
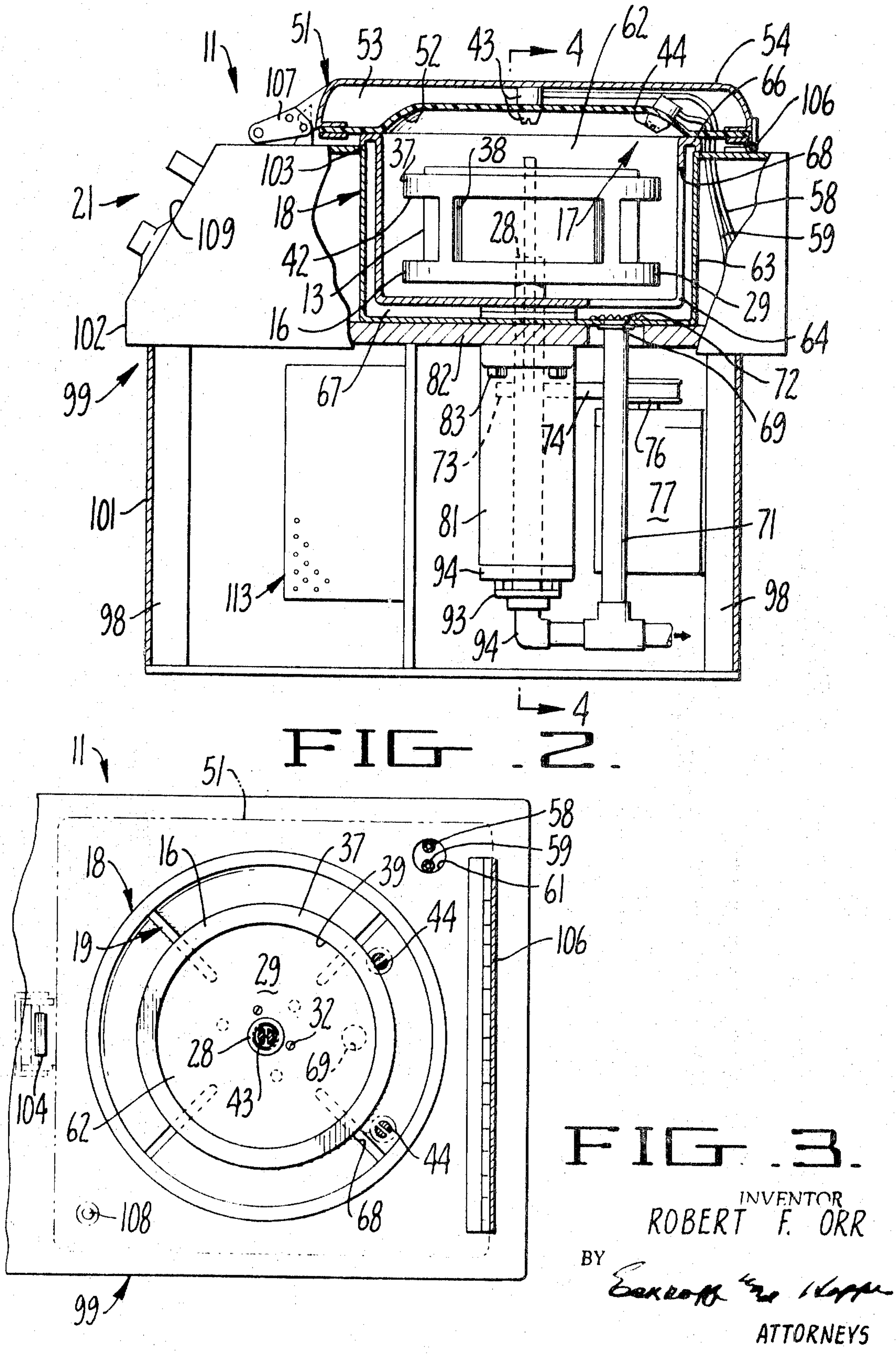
FIG. 2 is a fragmentary side elevational view of the device of FIG. 1.
FIG. 3 is a fragmentary plan view of the device of FIG. 1.

Looking to FIG. 1, it will be seen that the device 11 of the present invention has particular usefulness in rinsing and drying thin wafers 12, such as those used as microelectronic substrate and the like. The wafers are carried in baskets 13 with their faces in a radial orientation about a central axis 14. The device 11 incorporates rotary member 16 to support the basket in closely confining relation and to rotate the basket and included wafers about the central axis 14. Spray devices 17 are positioned adjacent the rotary member 16 to supply cleansing and purging fluids over the faces of the wafers. A tub 18 encircles the rotary member and has drain openings 19 for passage of the spent fluids. Also incorporated are independently adjustable control devices 21 cooperating to control the passage of the fluids to the spray devices and the rotation of the rotary member. These control devices include a rinse sequence timer 22 adapted to control the rinsing duration and the flow of the cleansing fluid to the spray device, a drying sequence timer 23 adapted to control the duration of the drying cycle and a speed control device 24 adjustable to control the speed of revolution of the rotary member during the drying cycle.

As mentioned, the wafers 12 are commonly carried in a basket 13 to facilitate handling and to obviate contaminating the wafers during subsequent processing. One type of available basket is generally circular and has a series of slots and webs forming an open grill work construction. These baskets support the wafers with their faces in an upstanding vertical position and radially disposed about a central hub 26. The hub 26 supports a rod-like handle 27 which is slidable therethrough to an upper carrying position (shown in solid line in FIG. 1) to a lower out of the way position (shown in phantom line in FIG. 1).

Also, these baskets are preferably molded from a Teflon-like plastic and support the wafers so as not to scratch or otherwise mar their faces. Of course, the particular basket chosen should not enclose the faces of the wafers. Similarly, the basket should allow ready draining of the fluids therefrom.

The aforementioned type of basket is provided in several sizes to accommodate different sizes and loads of wafers and this device has provision for receiving these different baskets.

The rotary member 16 is shown in FIG. 1 in solid lines and in an exploded position, and in phantom line in operative position wherein it is inside the tub and is carried on drive shaft 28. As shown, the rotary member 16 includes a base 29 having a bore 31 centrally thereof for receiving shaft 29 and attachment thereto by chucking device 32. Chucking device 32 takes the form of ball detents having clamping balls 33 carried in converging bores 34. Tightening screws 36 act to jam balls 33 against shaft 28 and secure the rotary member on the shaft. In this manner, the rotary member 16 may easily be removed and replaced with another when substitution is required to accommodate a different size basket.

To hold the basket, rotary member 16 has an annular ring 37 spaced above the base 29 on supports 38. Ring 37 has an inside diameter 39 corresponding to the diameter 41 to the periphery of the basket and provides a complementary seat for maximum support therefor during the spinning operation. Openings 42 between the ring 37 and base 29 provide ready passage for spent fluids away from the wafers and basket. This design of the rotary member also provides a substantial mass around the basket. This in turn ensures that the centrifugal mass of the rotary member is greater than the centrifugal mass of the combined wafers and acts to dampen any undesirable oscillations during the high speed spin which may be caused by unbalanced loading of the wafers.

The spray devices 17 include an inlet 43 for dry nitrogen gas and a pair of inlets 44 for deionized rinsing water.

The rinsing fluid spray devices 44 are carried above the path of the wafers and are patterned to stream the cleansing fluid over the faces of the wafers passing thereunder and so remove any foreign matter or contaminants therefrom.

The nitrogen gas inlet 43 is positioned above the central axis of rotary member 16 to supply an inert blanket of dry nitrogen over the wafers during the processing of the wafers.

The respective inlets 43 and 44 are connected to suitable sources of fluids through conduits 46 and 47 and the flow thereto is controlled by suitable valving such as solenoid valves 48 and 49.

As shown, the spray devices 17 are carried in a hinged lid 51 and are patterned around a recessed dome 52 therein. The plumbing for the spray devices is conveniently carried in space 53 provided between the plastic dome 52 and an outer shell 54 of lid 51.

Dome 52 in turn secured along the lip of shell 54 by clamping rim 56 with screws 57 to provide easy access to space 53 and the included plumbing. In this manner, the aforesaid spray pattern may be changed, if desired, by opening the lid and reconnecting the plumbing in any desired pattern. Fluid feed lines 58 and 59 enter the lid from the lower case through opening 61 and supply the appropriate fluids to the spray devices from their respective supply conduits 46 and 47.

Tub 18 is disposed below the lid and forms therewith a chamber 62 in which the rotary member 16 and a wafer filled basket 13 rotate and in which the rinsing and drying operations are performed. The tub has a double wall construction made up of outer tub 63 and spaced inner tub 64. Inner tub 64 has an upper flange 66 which bridges the space between the tubs and also forms a seal with the plastic lid portion 51. This acts to isolate chamber 62 from the outer environment and also forms a second chamber 67 between the spaced tubs.

As mentioned hereinbefore, the inner tube 64 has a plurality of perforations 19 through which the spent fluids drain to chamber 67. These perforations take the form of slots 68 radiating along the base and up the walls of tub 64. The inner tub wall is also coated with a plastic film or liner having a low coefficient of friction such as Teflon to which the fluids do not adhere. This ensures that the spent fluids will flush off of the inner wall and drain through perforations 68 to the interjacent chamber 67. Here the fluids and contaminates will be isolated from the cleansed wafers and cannot recontaminate them.

Drain opening 69 is provided in the outer tub 63 and communicates through drain line 71 with a suitable vented drain. Screen 72 extends over opening 69 to prevent any wafer chips from entering and clogging the drain.

As mentioned, the rotary member 16 is connected to and driven by shaft 28. Drive shaft 28 is in turn driven by pulley 72 through toothed belt 74 and drive pulley 76 from motor 77. Motor 77 is of the variable speed type and is operable within the range of speeds desired. That is, the motor is able to produce the slower speed of rotation during the rinsing sequence and then provide the higher speed during the spin drying sequence; thus during the rinsing sequence the rotary member is driven at under 100 rpm and during the drying sequence the shaft may rotate at between 2,000 to 3,000 rpm.

To accommodate these high speeds, shaft 28 is journaled in spaced ball bearings 78 and 79. The bearings are carried in frame 81 forming a yoke intermediate the shaft ends.

Yoke frame 81 is suspended from main frame member 82 on bolts 83. Outer tub 63 rests on main frame 82 and is attached to the upper end of the yoke by screws 84 around collar 86. Similarly, inner tub 64 is attached to yoke frame 81 with screws 87. A second spacer collar 88 is provided between the inner and outer tubs and has sockets 89 for holding the projecting head of screws 84. Sealing members 91 are provided along shaft 28 adjacent the tubs to prevent the fluids from leaking along the shaft.

Figure 4:
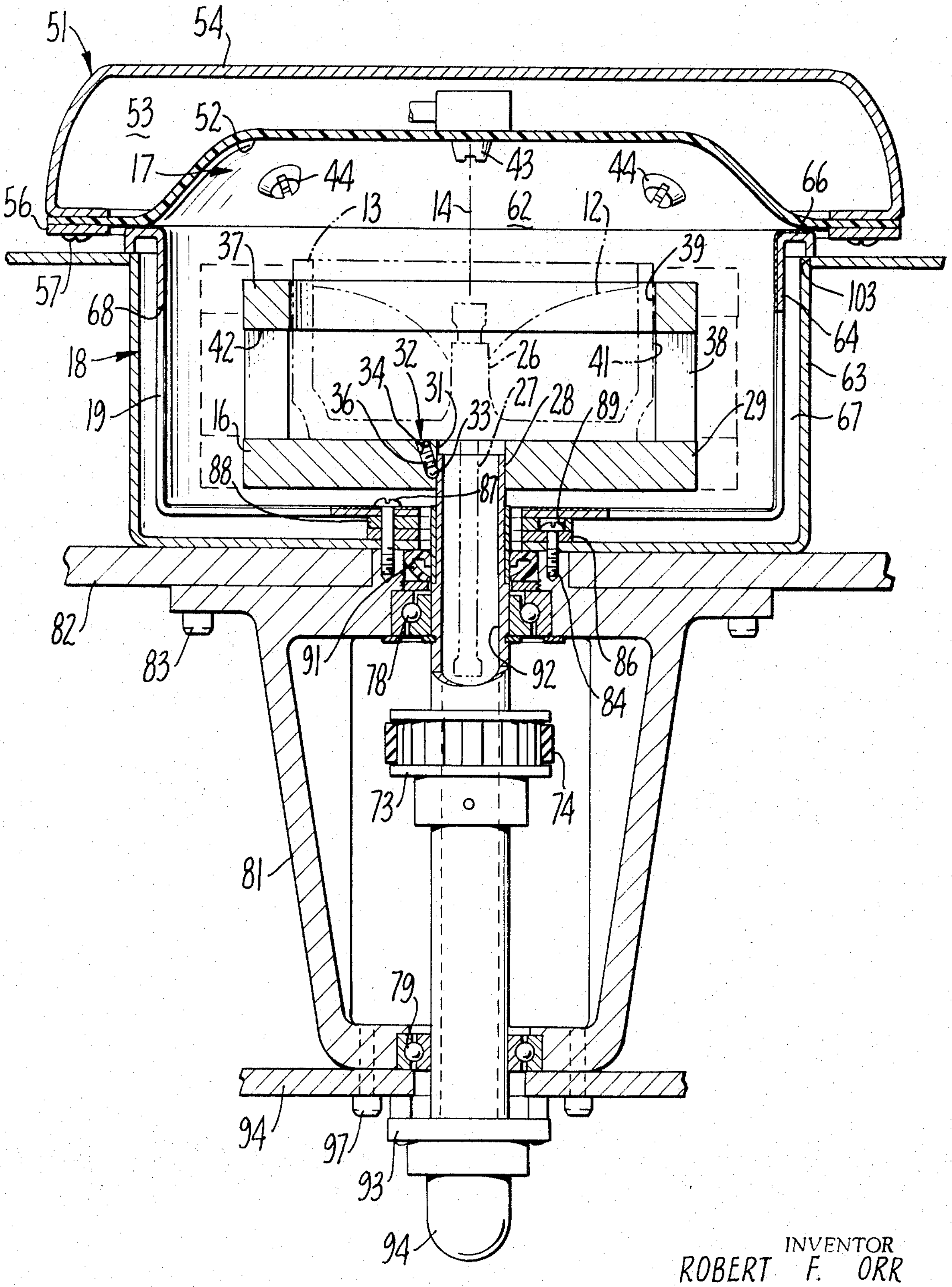
FIG. 4 is a partial cross-sectional view taken substantially along the plane of line 4—4 of FIG. 2.

Shaft 28 has bore 92 therethrough which is formed to accept handle 27 of basket 13 during the processing. This lends support to the handle during the spin sequence and prevents its from gyrating at these high speeds (see the handle in phantom line in FIG. 4). Bore 92 and shaft 28 terminates in rotary coupling 93 and communicates with drain line 94 leading to the vented drain. Thus fluid captured in the hollow shaft is quickly removed and does not recontaminate the wafers. Rotary coupling 93 is supported by plate 96 which is in turn attached to the lower end of yoke frame 81 by screws 97. In this manner, yoke frame 81 forms the locating points for the rotating parts and their immediate surroundings and ensures proper alignment of the parts during the fabrication of the device.

Main frame member 82 is suitably carried on supports 98 in a housing 99. The housing is constructed in two parts 101 and 102 which parts are separated along the plane of member 82. The lower housing 101 is of a reduced crossnsection to upper housing 102. This allows the device to be bench mounted in a suitable well with only the upper housing 102 in view above the bench.

The upper housing has opening 103 contiguous with the upper edge of the tub 18. Diametrically opposite opening 103 are lock plate 104 and hinge 106 for lid 51. Lid 51 is clamped on lock plate 104 by latch 107 when in the down position. Similarly, safety switch 108 is carried on upper housing 102 in position to engage lid 51 in the closed position. Safety switch 108 may be interposed in the electrical power lines in the conventional manner to interrupt the sequence whenever the lid is opened.

As is shown in FIG. 1, the control devices include an on-off switch 111 and Power fuse 112 for supplying power to the various interlocks and other control devices. A front panel 109 of upper housing 102 is canted to provide an easy view of the control devices 21 mounted thereon.

The rinse timer control 22 presents a calibrated dial which may be adjusted over its full range to control the duration of the rinsing cycle. In a conventional manner, one output of timer 22 controls solenoid valve 49 in rinsing fluid line 47 to control the flow of deionized water to spray device inlet 44. Timer 22 also controls motor 77 through a suitable motor control 113 to rotate the rotary member 16 and included wafers 12 under the spray device 17 at the mentioned slower speed. Another output timer 22 controls solenoid valve 48 in purging fluid line 46 and admit dry nitrogen gas while the rinsing sequence is in operation if desired.

A second timing device 23 is connected in tandem with first timer 22 and starts at the completion of the first timed sequence. One output of timer 23 opens solenoid valve 48 to admit dry nitrogen, if not already provided. ANother output of timer 23 is connected in series with speed control 24. Speed control 24 is calibrated in rpm's and can be set to select the motor speed for the optimum centrifugal force during the drying cycle. As mentioned, these speeds may vary over the full range of the speed control and are generally between 2,000 to 3,000 rpm depending on the wafer sizes and loadings. The interconnection of these control devices is arranged in any common fashion depending on the particular design of the timers. Generally, the timers take the form of a continuous stepping switch with selected contacts supplying the appropriate outputs to the valves and motor control.

The sequence of control is initiated when start switch 11 energizes the first timer 22. This timer supplies outputs to the slow motor control setting in motor control 113 and valves 48 and 49. At the completion of its set duration, timer 22 energizes the second timer 23 and in turn is reset for the next cycle. The second timer 23 then supplies an output to valve 48 and the fast speed setting of motor control 113. This setting is responsive to the speed control device 24. As mentioned, safety switch 108 and fuse 112 are in series with the power supply and are connected to interrupt the same if either the lid is opened or an electrical overload is detected.

In use in a processing cycle, the device 11 is set up and preprogrammed to run automatically a series of wafers of similar characteristics. In setting up the device, one of several rotary members 16 is chosen to provide the desired dimensional and rotary characteristics for the basket and wafer load to be run. The selected rotary member is then placed on shaft 28 and screws 36 are run down to jam the balls 33 against the shaft.

After several processing runs, a program of procedure is available from the different basket loads which may have been run. From this prior knowledge, the time durations and speed of the rinsing and drying sequences can be ascertained for the current batch. These settings are selected on the timers 22 and 23 and the speed control device 24.

With the proper rotary member in place, the basket and included wafers are placed therein. Lid 51 is closed and locked with latch 107 and start switch 116 pressed. Timer 22 commences the rinsing segment of the cycle and through its output it controls valves 48 and 49, motor control 113 and rinsing sequence light 114. The opening of solenoid valve 49 connects spray devices 17 to the deionized water supply. Motor 77 rotates the wafers under the water inlets 44 at the slower speed wherein any contaminates are rinsed off of the exposed faces and efficiently removed through perforations 68 to chamber 67 and drain line 71.

At the completion of the rinsing sequence, valve 49 is closed while timer 23 is energized and continues to hold valve 48 open. Similarly, timer 23, through motor control 113, shifts motor 77 to the higher speed as selected on speed control device 24. During this time segment, motor 77 runs at the higher rpm setting to provide the desired centrifugal force to remove any remaining water from the wafers. The spent fluids are efficiently removed through perforations or slots 68 into isolation chamber 67 and drain 71.

At any time during the rinsing or drying sequences the controls 21 may be changed if it is observed that they are not providing the desired results. Similarly, if at any time the lid 51 is lifted, switch 108 is opened to interrupt the cycle.

From the foregoing, it will be seen that a novel rinsing and drying device is provided for processing thin wafers in an efficient manner and which is compatible with and performs the desired results as specified in the manufacturing procedures of the electronic industry.

While only the preferred form of the invention is shown, it should be understood that various changes and modifications may be made within the scope of the claims attached hereto without departing from the spirit of the invention.

I claim:

1. A rinsing and drying device for batch processing of thin wafers and the like wherein the wafers are carried in a basket with their faces in a radial orientation about a central axis comprising:

a. a rotary member supporting the basket for rotation about said central axis;

b. spray devices positioned adjacent the rotary member and adapted to supply cleansing and purging fluids over the faces of the wafers;

c. a tub encircling the rotary member and defining a chamber containing the rotary member and basket and having drain openings for passage of the spent fluids; and d. separate and independently adjustable control devices cooperating to control the passage of the fluids to the spray devices and the rotation of the rotary member including:

1. a rinsing sequence timer to control the duration of flow of a cleansing fluid to the spray device;
2. a drying sequence timer to control the duration of a drying cycle; and
3. a speed control device to control the speed of revolution of the rotary member during the drying cycle.

2. The device as in claim 1 and wherein the rotary member is formed to provide a complementary socket to the periphery of the basket, a drive shaft removably carrying the rotary member to permit substitution of different sizes of rotary members to accommodate different size baskets and ensure close confinement of each basket.

3. The device as in claim 2 and in which said basket has a rod-like handle slidable in a central hub and wherein said drive shaft has a bore therein formed to accept said handle in confining relation to support the handle during the spin cycle and said bore forming a drain outlet for said spent fluids.

4. The device as in claim 1 and wherein said tub has a spaced double wall construction with an inner wall having a plurality of perforations forming passages to the interjacent area such that the spent fluids are isolated from the area of the wafers and ensures against recontaminating the cleansed wafers.

5. The device of claim 4 wherein the inner surface of the inner tub is coated with a plastic having a low coefficient of friction to facilitate the removal of the spent fluids.

6. The device of claim 1 wherein said tub cooperates with an overlying hinged lid to form the chamber in which the rotary member and wafer basket are housed and wherein a dry nitrogen gas emitted through said spray device facilitates purging the chamber of the spent cleansing fluid.

7. The device as described in claim 1 wherein said rotary member has a centrifugal mass greater than the centrifugal mass of said rotated wafers such to dampen any unbalanced loadings of said wafers.

8. The device of claim 1 wherein said spray devices include a dry nitrogen gas inlet positioned above and adjacent said central axis of the rotary member and a plurality of cleansing fluid inlets are positioned above the path of the wafers and directed to stream the cleansing fluid over the faces of the wafers passing thereunder.

9. The device of claim 1 wherein said purging fluid is a dry nitrogen gas emitted continuously during the rinsing and drying sequences to provide an inert blanket over the wafers during the entire processing period.

* * * * *